(12) United States Patent
Chrysler et al.

(10) Patent No.: US 6,650,542 B1
(45) Date of Patent: Nov. 18, 2003

(54) PIEZOELECTRIC ACTUATED JET IMPINGEMENT COOLING

(75) Inventors: Gregory M. Chrysler, Chandler, AZ (US); James G. Maveety, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/337,961

(22) Filed: Jan. 6, 2003

(51) Int. Cl.[7] .................................................. H05K 7/20
(52) U.S. Cl. ....................... 361/699; 361/698; 361/704; 257/714; 174/15.1; 165/80.4; 165/104.33
(58) Field of Search ................................. 361/689, 690, 361/699, 704; 257/706, 712, 714, 715; 174/15.1, 15.2; 165/80.4

(56) References Cited

U.S. PATENT DOCUMENTS 5,566,377 A * 10/1996 Lee ........................... 361/695
5,901,037 A * 5/1999 Hamilton et al. ............ 361/699
6,123,145 A * 9/2000 Glezer et al. ........... 165/104.33
6,349,554 B2 * 2/2002 Patel et al. ................. 62/259.2

* cited by examiner

*Primary Examiner*—Boris Chervinsky
(74) *Attorney, Agent, or Firm*—Paul J. Fordenbacher; Schwabe Williamson & Wyatt

(57) ABSTRACT

Embodiments in accordance with the present invention provides active thermal management of the heat generated at localized hot spots on the microelectronic die by using fluid impingement cooling. The combination of orifices constructed using piezoelectric microelectromechanical systems (MEMs) technology, fluid impingement for maximizing the heat transfer coefficient, and embedded thermal diodes within the microelectronic die for measuring local temperature, to produce an active, closed-loop flow-control system for managing hot spots. A small reservoir of fluid is stationed a small distance above the die. The base of the reservoir has an array of piezoelectric orifices embedded within it, and positioned over the hotspot(s). The piezoelectric orifices can be opened and closed depending on the voltage applied.

16 Claims, 1 Drawing Sheet

PIEZOELECTRIC ACTUATED JET IMPINGEMENT COOLING

FIELD OF THE INVENTION

The present invention relates to thermal management of microelectronic packaging and die, and, more particularly, to active cooling using feedback controlled impingement cooling.

BACKGROUND OF THE INVENTION

A microelectronic package comprises a microelectronic die electrically interconnected with a carrier substrate, and one or more other components, such as electrical interconnects, an integrated heat spreader, a heat sink, among others. An example of a microelectronic package is an integrated circuit microprocessor. A microelectronic die comprises a plurality of interconnected microcircuits within a carrier to perform electronic circuit functions.

A microelectronic die generates heat as a result of the electrical activity of the microcircuits. In order to minimize the damaging effects of heat, passive and active thermal management devices are used. Such thermal management devices include heat sinks, heat spreaders, and fans, among many others. There are limitations in the use of each type of device, and in many cases, the thermal management device is specifically designed for a particular microelectronic die and package design and intended operation.

Heat sinks are one type of passive thermal management device. The heat sink provides the transfer of heat from the surface of the microelectronic die to a large thermal mass, which itself incorporates a large surface area to convectively transfer the heat to the surrounding environment. Effective heat sinks tend to be very large and have sophisticated design with regards to fins and or pin heat releasing appendages.

Integrated heat spreaders (IHS) are passive thermal conducting lids or caps placed in intimate thermal contact with the backside surface of the microelectronic die. Integrated heat spreaders also have sides that extend to seal against the carrier substrate, containing and protecting the microelectronic die and the electrical interconnects from the environment. An integrated heat spreader also provides an enlarged flat surface into which a heat sink may be attached.

Non-uniform power distribution across the microelectronic die results in local areas of high heat flux, hot spots, that must be mitigated. The thermal management device must be able to maintain these hot spots at or below a specified temperature. This is very difficult when the local heat can be 10-times the microelectronic die average. Current devices are overwhelmed and limited in their ability to mitigate the temperature associated with these local high heat flux sources. The thermal resistance between the heat sink and/or heat spreader is not low enough to adequately provide the necessary thermal mitigation in a reasonably sized system.

Currently, the localized heat generation is dissipated away from the microelectronic die once the heat has diffused to the backside. An IHS, heat sink, and/or a fan coupled to the surface does not have a major effect on spreading heat at the local-level within the microelectronic die. As a result, high temperature gradients and high-localized temperatures will continue to exist using the external methods of cooling.

Apparatus and methods are needed to mitigate the effects of non-uniform power distribution and for providing the required heat flux distribution across the microelectronic die. They must provide for exceptionally small-scale integration, not interfere with the electrical interface of other components within the microelectronic package, and be inexpensive to manufacture.

DESCRIPTION

In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

Apparatus and methods in accordance with embodiments of the present invention utilize active cooling technology to reduce thermal gradients and operating temperature of a microelectronic die 16.

Figure 1:
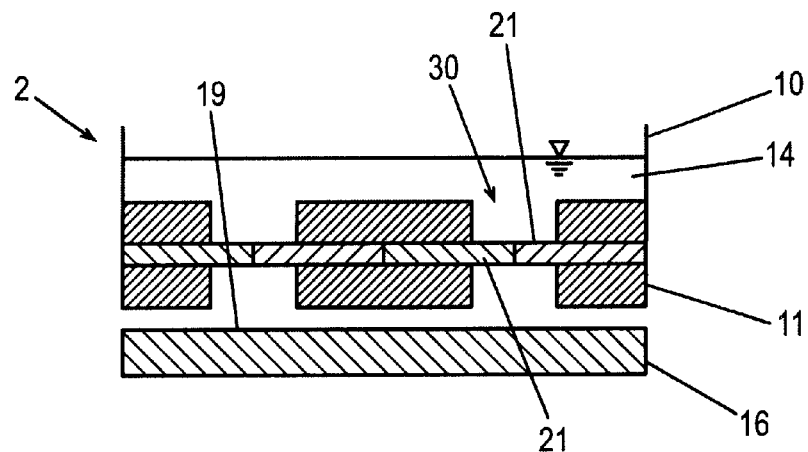
FIGS. 1 and 2 are cross-sectional views of an embodiment of a cooling system for cooling microelectronic die, in accordance with the present invention.
Figure 2:
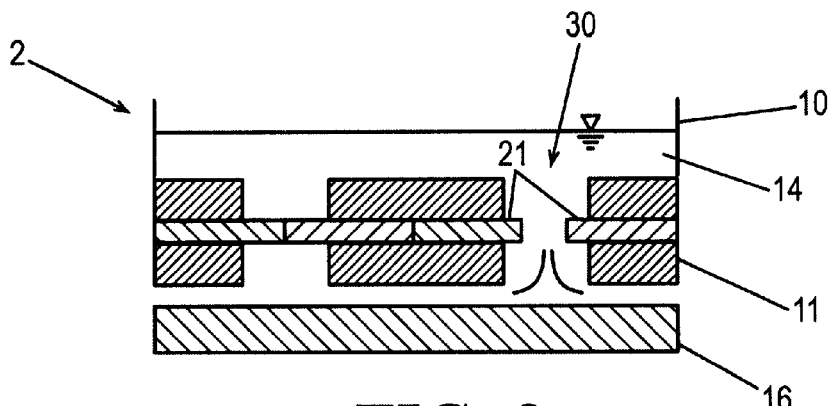

FIGS. 1 and 2 are cross-sectional views of an embodiment of a cooling system 2 for cooling a microelectronic die 16, in accordance with the present invention. The cooling system 2 comprises a reservoir 10 with a bottom 11 including one or more piezoelectric orifices 30. The bottom 11 of the reservoir 10 is positioned over the backside 19 of the microelectronic die 16, positioning the piezoelectric orifices 30 over locations requiring cooling. The reservoir 10 is adapted to contain a supply of fluid 14. In an embodiment, the bottom 11 of the reservoir 10 is positioned within I mm over the backside 19 of the microelectronic die 16.

FIG. 1 shows two piezoelectric orifices 30 in the closed position. FIG. 2 shows the right piezoelectric orifice 30 open. Each piezoelectric orifice 30 operates such that when open, fluid 14 impinges onto the microelectronic die 16, cooling that location as needed. Each piezoelectric orifice 30 is controlled by a preset voltage provided by a temperature sensor (not shown), such as, but not limited to, a thermal diode, in the location to be cooled. The expelled fluid 14 is collected and cycled back to the reservoir 10 using a pump 13, such as, but not limited to, an electrokinetic (EK) pump.

The piezoelectric orifices 30 are arranged to concentrate the fluid on high heat flux areas(s) of the microelectronic die 16. For example, an area on the microelectronic die 16 comprising high power density floating point circuits is a high heat flux area, whereas an area comprising low power density cache memory circuits is a low heat flux area. The piezoelectric orifices 30 are arranged with respect to the circuit design to provide cooling resulting in a microelectronic die 16 having a more uniform temperature.

A piezoelectric orifice 30 is a solid state device without wearing parts. In the embodiment of FIGS. 1 and 2, each piezoelectric orifice 30 comprises a pair of piezoelectric elements 21 forming a butt joint. The piezoelectric elements 21 contract when stressed with a predetermined level of voltage, thus opening the piezoelectric orifice 30. When the voltage drops below the predetermined level, the piezoelectric elements 21 elongate to their original position, thus closing the piezoelectric orifice 30. The piezoelectric elements 21 operate instantaneously with no power surge.

Figure 3:
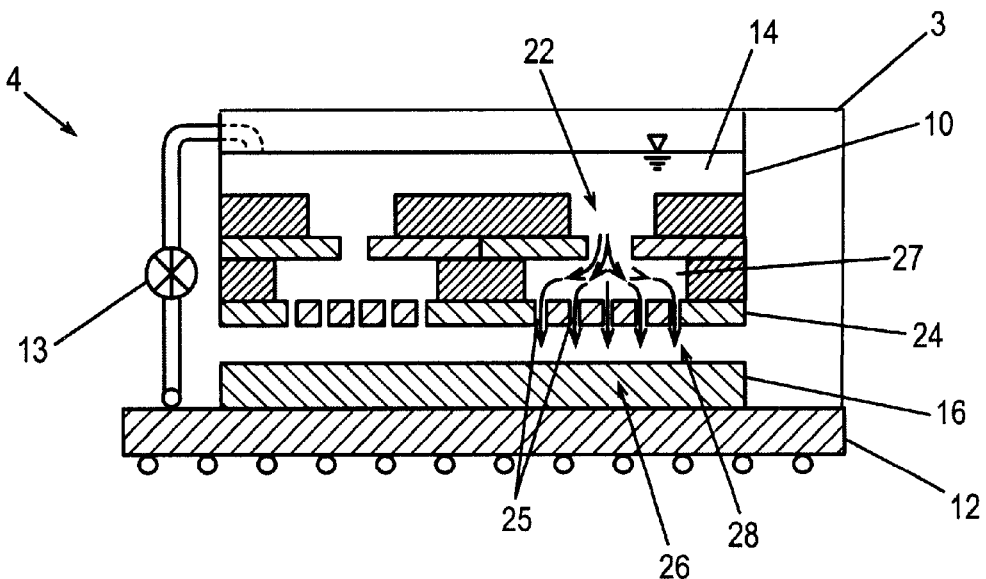
FIG. 3 is another embodiment of a cooling system in accordance with the present invention.

FIG. 3 is another embodiment of a cooling system 4 in accordance with the present invention. A microelectronic package 3 comprises a microelectronic die 16 (illustrated as a flip-chip, but not limited thereto) electrically interconnected with a carrier substrate 12. A reservoir 10 is provided with a bottom 24 having a plurality of fixed orifices 25 forming an orifice group 26. Each orifice group 26 is fed by a single plenum 27 controlled by a single piezoelectric orifice 22. The orifice group 26 creates a group of fluid jets 28 over an area to provide impingement on sections of the microelectronic die 16. The microelectronic die 16 is segmented into sections or blocks, with one or more individually controlled orifice group 26 providing fluid coverage over each block.

Each piezoelectric orifice 22 supplying the orifice group 26 operates in one of two states; partially open or fully open. The partially open state ensures that there is always fluid 14 passing through the piezoelectric orifice 22. Modulation of each piezoelectric orifice 22 controls the fluid jets 28 issuing from the plurality of fixed orifices 25 directed at a block cooled by that orifice group 26. A separate temperature sensor (not shown) for each block is used to control the voltage signal, and thus, the size of the opening of the piezoelectric orifice 22.

By utilizing a small number of larger piezoelectric orifices, each feeding into multiple fixed orifice cooling regions of the microelectronic die 16, a more uniform microelectronic die 16 temperature can be achieved with a minimum number of temperature sensors. In addition, as the power dissipation of one block increases, due to requirements from a running application, the distribution of the fluid 14 across the microelectronic die 16 can be rapidly modulated to follow the new power distribution.

Localized heating over the floating point circuits on the microelectronic die 16 can reach heat fluxes on the order of 350W/cm$^2$ and the localized temperature can reach values as high as 130° C. The cooling systems provided in accordance with the present invention providing for impinging fluid directly on the hot spot areas provides an efficient method of heat removal. This is important because dissipating the high heat flux areas on the microelectronic die 16 reduces internal thermal gradients reducing thermal stress and generates a more uniform heat flux leaving the microelectronic die 16 which is a more efficient way to dissipate the total heat. Both items improve microelectronic die 16 reliability.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A thermal management device comprising:
    a reservoir having a bottom;
    at least one piezoelectric orifice located in the bottom, the piezoelectric orifice adapted to control the flow of fluid held within the reservoir; and
    at least one temperature sensor adapted to provide a voltage corresponding to temperature to one or more piezoelectric orifices, the piezoelectric orifices adapted to open a predetermined amount when provided with a predetermined voltage.

2. The device of claim 1, wherein a higher density of piezoelectric orifices are distributed on the base of the reservoir corresponding to areas requiring more cooling.

3. The device of claim 1, wherein the piezoelectric orifices are adapted to operate independent from the other piezoelectric orifices.

4. The device of claim 1, further comprising a pump, the pump adapted to transfer the expelled fluid to the reservoir.

5. The device of claim 1, wherein the reservoir bottom surface is positioned above a backside of a microelectronic die, the higher density of orifices positioned over the hottest area of the backside.

6. The device of claim 1, further comprising a plurality of fixed orifices in the bottom forming an orifice group, each orifice group fed by a single plenum controlled by a single piezoelectric orifice.

7. A method for thermal management of one or more heat producing components comprising:
    determining the temperature of the heat producing component with one or more temperature sensor in thermal contact with one or more areas of the heat producing component, the sensors adapted to provide a voltage in relationship to the temperature;
    controlling the volume of fluid expelled from piezoelectric orifices located on a bottom of a reservoir onto the heat producing component, the piezoelectric orifices opened by the voltage provided by the temperature sensor;
    collecting the expelled fluid; and
    pumping the expelled fluid into the reservoir.

8. The method of claim 7, wherein controlling the volume of fluid expelled from piezoelectric orifices located on a bottom surface of a reservoir containing fluid comprises:
    controlling the volume of fluid expelled from piezoelectric orifices located on a bottom surface of a reservoir containing fluid, the reservoir further comprising a plurality of fixed orifices in the bottom forming an orifice group, each orifice group fed by a single plenum controlled by a single piezoelectric orifice, the flow of fluid through each orifice group is controlled by the piezoelectric orifice.

9. The method of claim 7, wherein controlling the volume of fluid expelled from piezoelectric orifices located on a bottom of a reservoir comprises:
    controlling the volume of fluid expelled from piezoelectric orifices located on a bottom of a reservoir wherein a higher density of piezoelectric orifices are distributed on the base of the reservoir corresponding to areas requiring more cooling.

10. A microelectronic assembly comprising:
    a microelectronic die;
    a reservoir having a bottom;
    at least one piezoelectric orifice located in the bottom, the piezoelectric orifice adapted to control the flow of fluid held from within the reservoir onto the microelectronic die; and
    at least one temperature sensor adapted to provide a voltage corresponding to temperature to one or more piezoelectric orifices, the piezoelectric orifices adapted to open a predetermined amount when provided with a predetermined voltage.

11. The device of claim 10, wherein a higher density of piezoelectric orifices are distributed on the base of the reservoir corresponding to areas on the microelectronic die requiring more cooling.

12. The device of claim 10, wherein the piezoelectric orifices are adapted to operate independent from other piezoelectric orifices.

13. The device of claim 10, further comprising a pump, the pump adapted to transfer the expelled fluid to the reservoir.

14. The device of claim 10, wherein the reservoir bottom surface is positioned above a backside of the microelectronic die, higher density of orifices positioned over the hottest area of the backside.

15. The device of claim 10, further comprising a plurality of fixed orifices in the bottom forming an orifice group, each orifice group fed by a single plenum controlled by a single piezoelectric orifice, one or more orifice groups providing fluid to a predetermined area on the microelectronic die.

16. The device of claim 13, wherein the pump comprises an electrokinetic pump.

* * * * *

UNITED STATES PATENT AND TRADEMARK OFFICE
CERTIFICATE OF CORRECTION

PATENT NO.    : 6,650,542 B1
DATED         : November 18, 2003
INVENTOR(S)   : Chrysler et al.

It is certified that error appears in the above-identified patent and that said Letters Patent is hereby corrected as shown below:

Column 4,
Line 66, "areas on the" should read -- areas of the --.

Signed and Sealed this

Twenty-eighth Day of December, 2004

JON W. DUDAS
*Director of the United States Patent and Trademark Office*